United States Patent [19]
Kashiwada

[11] Patent Number: 6,054,763
[45] Date of Patent: Apr. 25, 2000

[54] SEMICONDUCTOR DEVICE

[75] Inventor: Junji Kashiwada, Tokyo, Japan

[73] Assignee: Oki Electric Industry Co., Ltd., Tokyo, Japan

[21] Appl. No.: 09/115,261

[22] Filed: Jul. 14, 1998

[30] Foreign Application Priority Data

Oct. 31, 1997 [JP] Japan .................................. 9-315787

[51] Int. Cl.$^7$ ........................... H01L 23/02; H01L 23/48; H01L 23/34
[52] U.S. Cl. ........................ 257/723; 257/685; 257/686; 257/691; 257/694
[58] Field of Search .................................. 257/723, 685, 257/686, 777, 666, 691, 694

[56] References Cited

U.S. PATENT DOCUMENTS

| | | | |
|---|---|---|---|
| 4,868,634 | 9/1989 | Ishida et al. | 257/723 |
| 5,410,450 | 4/1995 | Iida et al. | 361/736 |
| 5,448,451 | 9/1995 | Takubo et al. | 257/668 |
| 5,475,264 | 12/1995 | Sudo et al. | 257/723 |
| 5,917,236 | 6/1999 | Leader et al. | 257/723 |

FOREIGN PATENT DOCUMENTS

| | | | |
|---|---|---|---|
| 28 39 215 | 3/1979 | Germany . | |
| 43 01 915 | 5/1994 | Germany . | |
| 61-284951 | 12/1986 | Japan . | |
| 1-25554 | 1/1989 | Japan | 257/723 |
| 1-205457 | 8/1989 | Japan . | |
| 5-235092 | 9/1993 | Japan . | |
| 5-335451 | 12/1993 | Japan | 257/723 |
| 6-61413 | 3/1994 | Japan | 257/723 |

*Primary Examiner*—Mahshid Saadat
*Assistant Examiner*—Jhihan B Clark
*Attorney, Agent, or Firm*—Jones Volentine, LLP

[57] ABSTRACT

A semiconductor device 10 enables efficient use of semiconductor wafer and higher productivity by splitting an electric circuit function into a plurality of semiconductor chip portions 12 and interconnecting the plurality of semiconductor chip portions 12 on a single carrier tape.

12 Claims, 8 Drawing Sheets

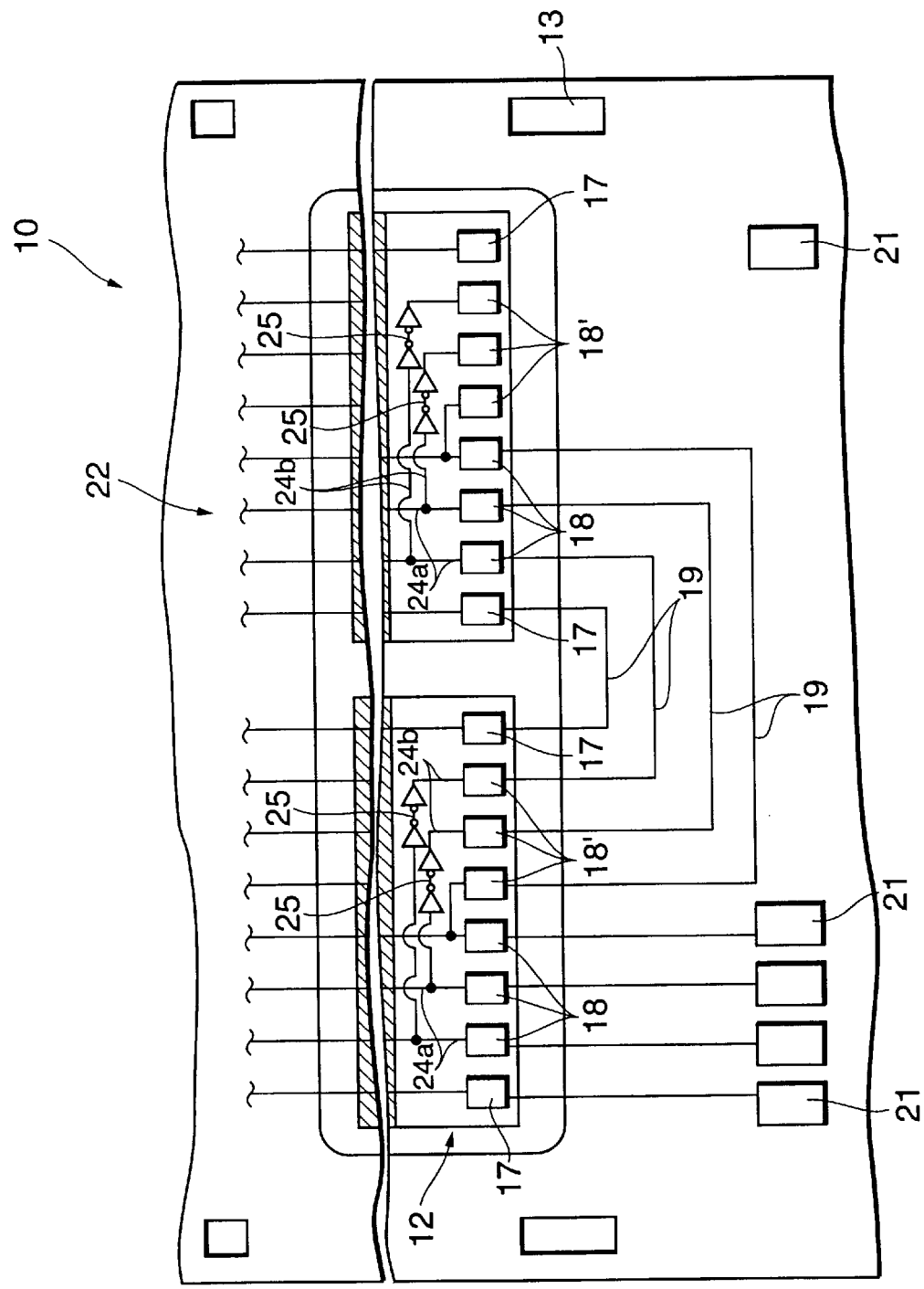

SEMICONDUCTOR DEVICE

BACKGROUND OF THE INVENTION

1. Field of the Invention

The present invention relates to a semiconductor device which is formed by fabricating an integrated circuit in a semiconductor substrate.

2. Prior Art

In the manufacture of semiconductor chips, generally, a large number of identical integrated circuits are formed in the individual blocks on a semiconductor wafer, then those blocks are separated, and thus a large number of semiconductor chips as many as the individual blocks are produced together efficiently.

When a large number of semiconductor chips are obtained from one semiconductor wafer, the larger the area of each individual semiconductor chip, the smaller the number of semiconductor chips becomes which are produced from limited area of a semiconductor wafer. The semiconductor chips found to contain defects are discarded. As the area of semiconductor chips discarded increases, the area of a semiconductor wafer discarded becomes larger and the productivity becomes lower. Therefore, for better use of semiconductor wafer and higher productivity, it is desirable to reduce the size of the semiconductor chips separated from a semiconductor wafer.

However, despite the demand for down-sizing of semiconductor chips, there is a trend for the size of high-density semiconductor chips to be increasing in pursuit for compact-size semiconductor devices incorporating semiconductor chips.

An example of a semiconductor device using this kind of semiconductor chip is a semiconductor device disclosed in JP-A-05-235092.

According to this prior art, in semiconductor devices for driving a liquid crystal panel, by successively arranging a plurality of liquid-crystal-panel-drive IC chips having identical functions on one carrier material, and conducting a control signal for those IC chips through the liquid-crystal-panel-drive IC chips with an identical function, the number of external connection terminals on the carrier material can be decreased, and the resulting decrease in mounting area enables the size reduction of semiconductor devices.

SUMMARY OF THE INVENTION

However, in this kind of the semiconductor device, to achieve a further size reduction, it is required to increase the number of output terminals on each IC chip to the liquid crystal panel, and accordingly there is a trend toward the prolongation of one edge, where the output terminals are provided of each IC chip, so that IC chips show a steady prolongation and slimming.

Another problem attending on the efforts toward compact devices is that if there is any defective IC chip on the carrier material, all the IC chips on that carrier material must be discarded.

The slimming of the IC chips hinders better use of semiconductor wafer and higher productivity. The reason is as follows. Because rectangular IC chips are formed on a substantially round semiconductor wafer, unusable regions are left in the peripheral portion of the semiconductor wafer. In contrast to a square IC chip, a rectangular IC chip with the same area has a greater area of unusable regions as the ratio moves away from 1, in other words, as the slimming progresses.

Accordingly, there has been demand for technology by which to provide a semiconductor device enabling better use of semiconductor wafer and higher productivity.

For utmost use of semiconductor wafer and improved productivity, technology has been sought after which enhances the reliability of the lead circuits for connecting the IC chips' output terminals with the terminals on the carrier tape and which therefore increases yield.

The present invention adopts the following arrangements to solve the above problems.

The feature of the present invention is that one electric circuit function is split into a plurality of semiconductor chips and the plurality of semiconductor chips are interconnected to form an integrated structure on a single carrier tape.

A semiconductor device according to the present invention comprises a plurality of semiconductor chips, each having formed thereon a subdivision circuit portion of an electric circuit to perform one specified function; and a single carrier material for holding the semiconductor chip portions, wherein the circuit portions are electrically interconnected to form the electric circuit by said circuit portions in the respective semiconductor chip portions held on the carrier material.

According to the present invention, the electric circuit with the specified function is formed of the plurality of semiconductor chips, and the plurality of semiconductor chips are electrically connected to perform the specified function on the carrier material for holding the semiconductor chips.

Therefore, the area of the semiconductor chips is reduced to less than that in the prior art and the slimming of the semiconductor makes considerable progress. On account of this, the number of semiconductor chips obtainable from a limited area of a semiconductor wafer is substantially increased, and accordingly productivity improves in the manufacture of semiconductor chip portions and semiconductor devices formed by connecting the chip portions on the carrier material.

Since the IC circuit on the carrier material is originally a circuit to perform a specified function, if there is any defect in one semiconductor chip, the whole IC circuit on the carrier material must be abandoned. In this case, the amount of circuits discarded is the same as before.

Another semiconductor device according to the present invention comprises a plurality of semiconductor chips generally in a rectangular shape, each having a plurality of input terminals on one edge and a plurality of output terminals on the other edge; a carrier material for holding semiconductor chips in a row to arrange the input terminals and the output terminals of the semiconductor chips in rows and also having input electrodes and output electrodes provided to correspond to the terminals of the semiconductor chips; and a lead circuit including first lead circuit portions and second lead circuit portions, each first circuit portion connecting an output electrode on the carrier material with an output terminal on the semiconductor chip and each second circuit portion connecting an input electrode on the carrier material with an input terminal on the semiconductor chip.

The spaces between the output electrodes on the carrier material corresponding to the output terminals on the semiconductor chips are wider than the spaces between the output terminals, and each first lead circuit portion connecting between the output electrode and the output terminal includes a first straight portion extending from an output terminal outwardly of the semiconductor chip substantially at right angles from the edge portion of the semiconductor chip, wherein the first straight portions extend evenly spaced apart from one another, a diagonally extending portion extending from the outer end of the straight portion at an angle to the straight portion, and each second straight portion extending from the outer end of the diagonally extending portion up to the corresponding output electrode.

The plurality of semiconductor chips are held on the carrier material arranged in an alignment direction, evenly spaced for a predetermined distance.

By arranging a plurality of semiconductor chips on a carrier material, each chip having a plurality of output terminals provided on one side, high density circuit integration in a compact space is realized, and output electrodes corresponding to the output terminals are provided on the carrier material.

For the first lead circuit portions connecting the output electrodes on the carrier material with the corresponding output terminals on the semiconductor chips, to secure the reliability of the lead circuit portions, equal spaces should be provided between the first straight portions, between the diagonally extending portions, and between the second straight portions.

To prevent the size of the semiconductor device from becoming large, it is necessary to prevent increases in the length in the alignment direction of the output electrodes and the width as well.

Furthermore, to provide a secure electrical connection between the output electrodes and an electric element, such as a liquid crystal panel, it is required to provide a wider space between the output electrodes.

In a single semiconductor chip with a number of output terminals equal to the sum of the numbers of output terminals on a plurality of semiconductor chips, to prevent an enlargement of the semiconductor device, if an attempt is made to set a wider space between the output electrodes, for example, under the condition that a space of a predetermined value is held between the row of output terminals on the semiconductor chips and the row of the output electrodes on the carrier material, the inclination of the diagonally extending portions in the first lead circuit portions becomes large, and in proportion to the increase in this inclination, the space between the diagonally extending portions becomes small, which results in a deterioration of the reliability of the lead circuit portions.

Therefore, with the first lead circuit portions of a single semiconductor chip, it is impossible to satisfy all of the abovementioned three requirements.

In contrast, if a proper space is held between a plurality of semiconductor chips to which the output terminals are divided and distributed and arranged in a row, it is possible to meet the abovementioned three requirements. By this arrangement, it is possible to provide a compact high-density semiconductor device superior in reliability without incurring an increase in device size.

The individual semiconductor chips may be IC chips provided with an identical function, such as IC chips for liquid crystal panel drive. In addition, the IC chips can be formed in a rectangular shape and can be longitudinally aligned in a straight row, and by this arrangement, improving mounting efficiency can be improved.

When common terminals are provided on each semiconductor chip to interconnect the semiconductor chips, the common terminals can be interconnected by second lead circuit portions on the carrier material. By this method, the number of signal input terminals, the number of signal output terminals, and the number of power input terminals can be made the same as those of a semiconductor device with one electric circuit function before splitting into a plurality of chips.

Branch terminals for interconnecting the common terminals by the second lead circuit portions can be provided on each semiconductor chip.

The common terminals on the semiconductor chips can be connected with the branch terminals by multiple layers wiring technology.

The common terminals and the branch terminals on the semiconductor chips can be symmetrically arranged about imaginary centerlines. By this arrangement, the second lead circuit portions can be simplified without forming intersections in the second lead circuit portions which would make the circuits complicated.

Buffers to prevent signal attenuation can be included in the circuits of the branch terminals on the semiconductor chips.

BRIEF DESCRIPTION OF THE DRAWINGS

FIG. 8 is a plan view, partially on an enlarged scale, of the semiconductor device according to the present invention.

DESCRIPTION OF THE PREFERRED EMBODIMENTS

Description will be made of preferred embodiments of the present invention with reference to the accompanying drawings.

Embodiment 1

Figure 1:
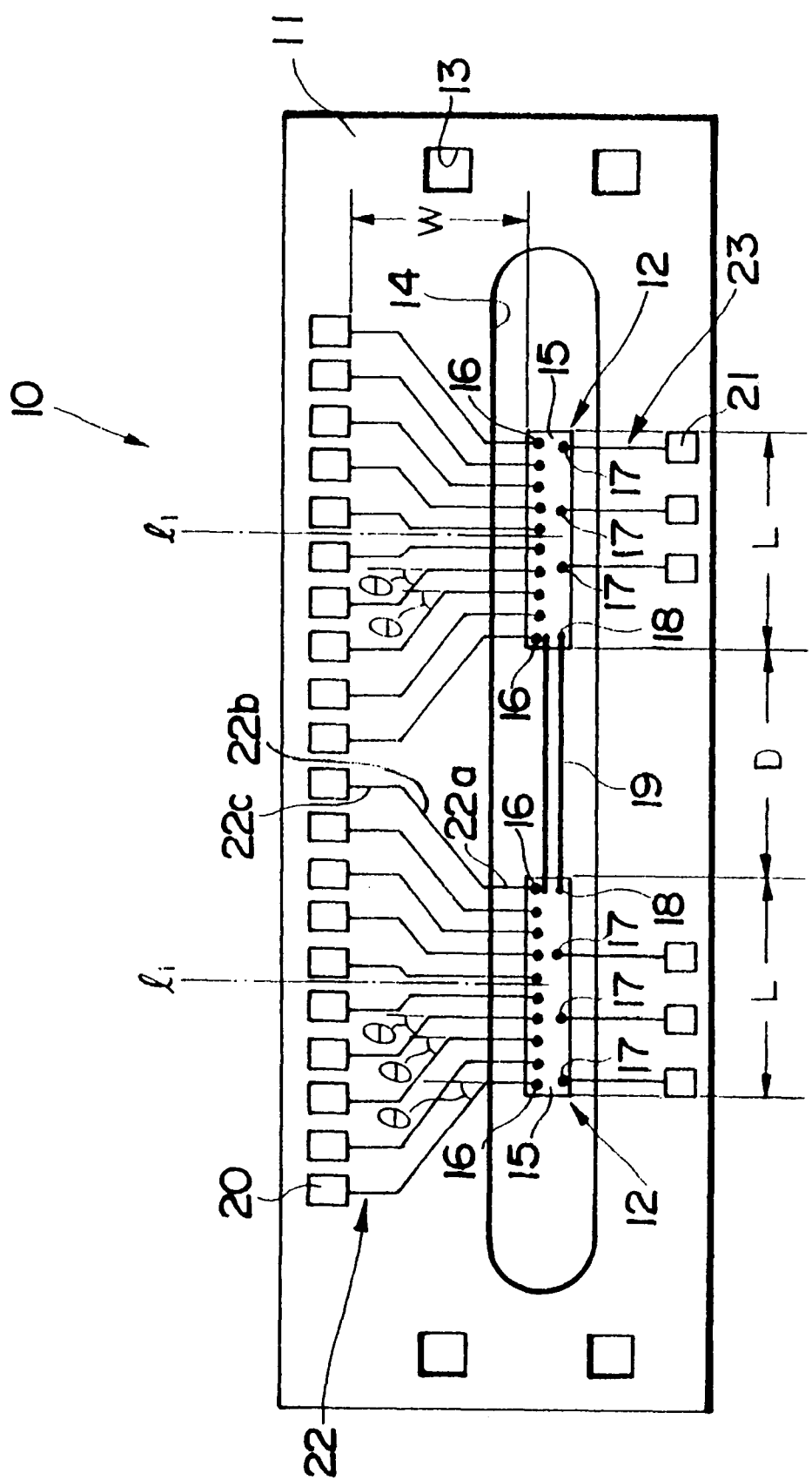
FIG. 1 is a plan view showing a first embodiment of the semiconductor device according to the present invention.

FIG. 1 shows a first embodiment of the semiconductor device according to the present invention.

A semiconductor device 10 according to the present invention includes a carrier material 11 and a plurality of chip portions 12 held on the holding material. In each embodiment described in this specification, two chip portions 12 are identical in longitudinal dimension L.

The semiconductor 10 is a liquid crystal panel driver carried on a TAB (tape automated bonding) tape as the carrier material 11.

The TAB tape 11 includes a single and long device hole 14 extending in the transverse direction of the TAP tape 11 between the sprocket holes 13 along the both edge portions of the tape.

A pair of long and narrow chip portions 12 generally in a flat and rectangular shape are arranged in the device hole 14.

The two chip portions 12 are arranged spaced for a distance D, for example, with their longitudinal directions aligned with each other.

In each of the semiconductor substrates 15 of the two chip portions 12, there is provided an integrated circuit portion (not shown), which constitutes a well-known driver circuit for a liquid crystal panel. The two circuit portions perform one specified function.

On one edge of each chip portion 12, output terminals 16 of the integrated circuit portion are formed in a line at regular intervals. On the other edge of the chip portion 12, input terminals of the integrated circuit portion are formed in a line at regular intervals. The two chip portions 12 have common terminals 18 provided at the end portions close to each other, and the opposing common terminals 18 of the two chip portions 12 are interconnected by connecting lines 19 serving as the connection circuits.

By forming an electrical connection of the common terminals 18 outside the semiconductor substrates 15 of the liquid crystal panel driver, the two chip portions 12 become an electrically single body, and work as a single driver circuit. The chip portions 12 containing the two separate integrated circuit portions, which function as a single driver circuit, correspond to the two transversely split half portions of a 2L-long semiconductor substrate incorporating the conventional driver circuit.

On one edge portion of the TAB tape 11, output electrodes 20 corresponding to the output terminals 16 are arranged in a line parallel with the row of the output terminals 16 and spaced by a predetermined distance apart from the chip portions 12. Those output electrodes 20 are evenly spaced.

On the other edge portion of the TAB tape 11, input electrodes 21 corresponding to the input terminals 17 are arranged in a line parallel with the row of the input terminals 17. The input electrodes 21 are evenly spaced, and some of the input electrodes 21 are used as power supply electrodes, and the rest of the input electrodes 21 are used as electrodes for input signals or input and output signals.

The output terminals 16 and the corresponding output electrodes 20 are connected by first lead circuit portions 22 formed on the TAB tape 11, while on the other hand the input terminals 17 and the input electrodes 21 are connected by second lead circuit portions 23 formed on the TAB tape 11.

In the example shown in FIG. 1, the second lead circuit portions 23 extend from the input terminals 17 outwardly of the semiconductor substrate 15 at right angles from the edge portions of the semiconductor substrates 15 up to the input electrodes 21.

On the other hand, each of the first lead circuit portions 22 includes a first straight portion 22a extending from an output terminal 16 outwardly of the semiconductor substrate 15 at right angles from the edge portion of the semiconductor substrate 15, a diagonally extending portion 22b extending from the outer end of the straight portion 22a at an angle to the straight portion 22a, and a second straight portion 22c extending from the outer end of the diagonally extending portion 22b up to the corresponding output electrode 20.

The diagonally extending portions 22b of the first lead circuit portions 22 are symmetrically arranged about the imaginary lines crossing the middle portions of each chip portion 12. Each diagonally extending portion 22b extends at an inclination to the first straight line 22a and goes outwardly away from the imaginary line.

Thus, the first lead circuit portions 22 are formed such that the portions 22a, 22b and 22c are evenly spaced.

The device hole 14 is filled with a well-known resin used to encapsulate the chip portions 12, so that the chip portions 12 are held securely.

In the conventional semiconductor device, a single chip with a longitudinal dimension of about 2L is used. If an attempt is made to increase the inclination (θ) of the diagonally extending portions 22a in order to widen the spaces between the output electrodes while maintaining the predetermined value of the distance W between the output electrodes and the chip, then there is a danger of deteriorating the reliability of the first lead circuit portions 22.

In contrast, in the semiconductor device 10 according to the present invention, there are two divided chip portions 12 separated by a distance D, so that this distance can be used to provide larger spaces between the output electrodes 20. For this reason, the lead portions 22a and 22c can be connected without reducing the spaces between the diagonally extending portions 22b while maintaining the predetermined value of the distance W between the output electrodes 20 and the chip portions 12.

Therefore, the spaces between the output electrodes on the TAB tape 11 can be widened without incurring an increase in the size of the TAB tape 11.

The widening of the spaces between the output electrodes 20 ensures and facilitates the connection of those electrodes with the connection terminals of the liquid crystal panel, and contributes a great deal to the improvement of the reliability of the electrical connections.

The spaces between the integral portions 22a, 22b and 22c of the first lead circuit portions 22 can be secured by preventing the increase in the dimension of the TAB tape 11. Consequently, the spaces between the output electrodes 20 can be made wider without enlarging the size of the semiconductor device 10 and without sacrificing the reliability of the first lead circuit portions 22.

Furthermore, the TAB tape 11 can be reduced in size without reducing the spaces between the output electrodes 20 and without reducing the spaces between the integral portions 22a, 22b and 22c of the first lead circuit portions 22.

In addition, by using semiconductor chip portions 12 with a length of L about half as long as the semiconductor chip of the conventional size and by interconnecting the integrated circuit portions fabricated in the couple of semiconductor substrates 15, the liquid crystal driver according to the present invention can perform the function equivalent to that of the conventional driver circuit chip containing a single driver circuit.

Therefore, it is possible to obtain substantially an increased number of chips from a single semiconductor wafer, each comprising two semiconductor chip portions 12, so that the semiconductor devices 10 can be manufactured at lower cost.

Embodiment 2

Figure 2:
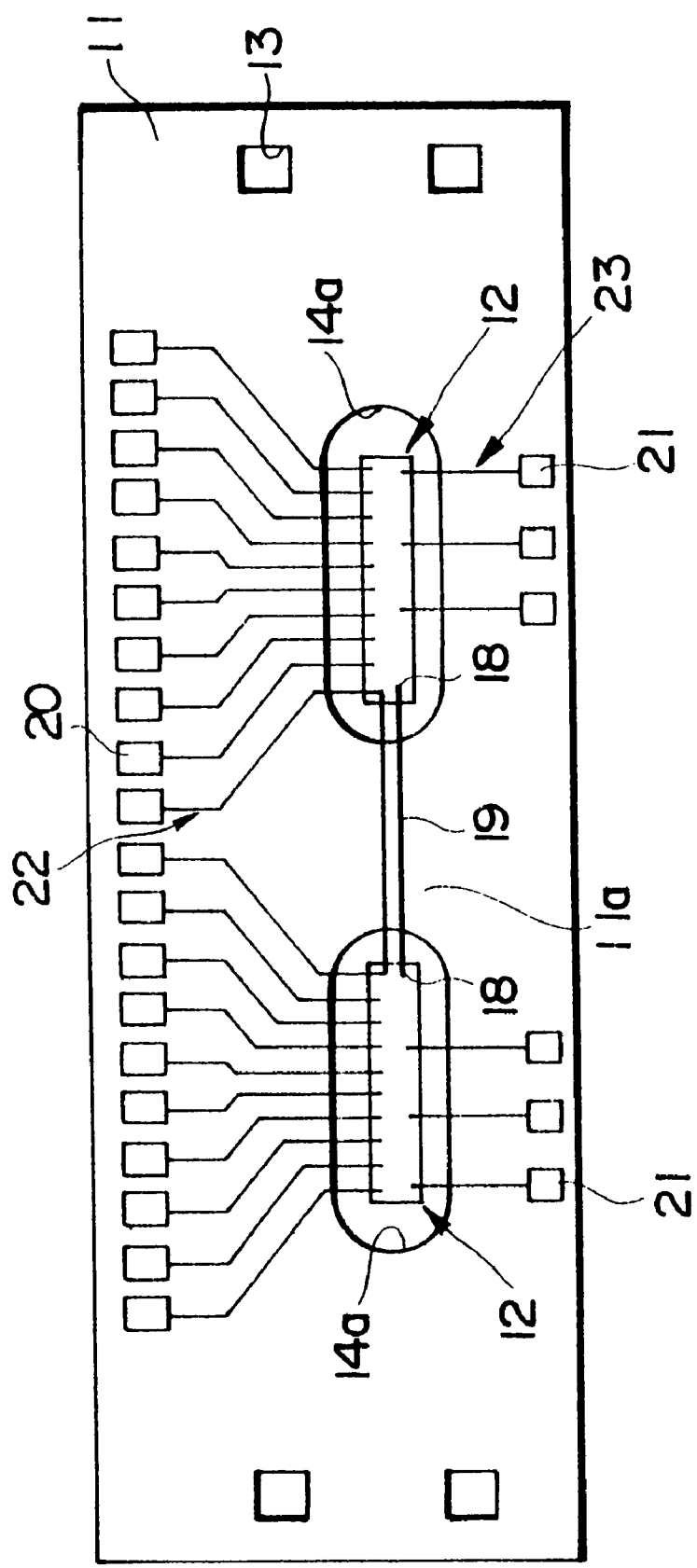
FIG. 2 is a plan view showing a second embodiment of the semiconductor device according to the present invention.

FIG. 2 shows a second embodiment of the present invention.

In the first embodiment, the connecting lines 19 for interconnecting the common terminals 18 of the two chip portions 12 are arranged in the device hole 14. In contrast to the first embodiment, a small-size device hole 14a can be formed for each chip portion 12 as shown in FIG. 2, and the connection lines 19 can be held securely in a bridge portion 11a between the two device holes in the TAB tape 11, and thus the durability and reliability of the connection lines 19 can be improved.

Embodiment 3

Figure 3:
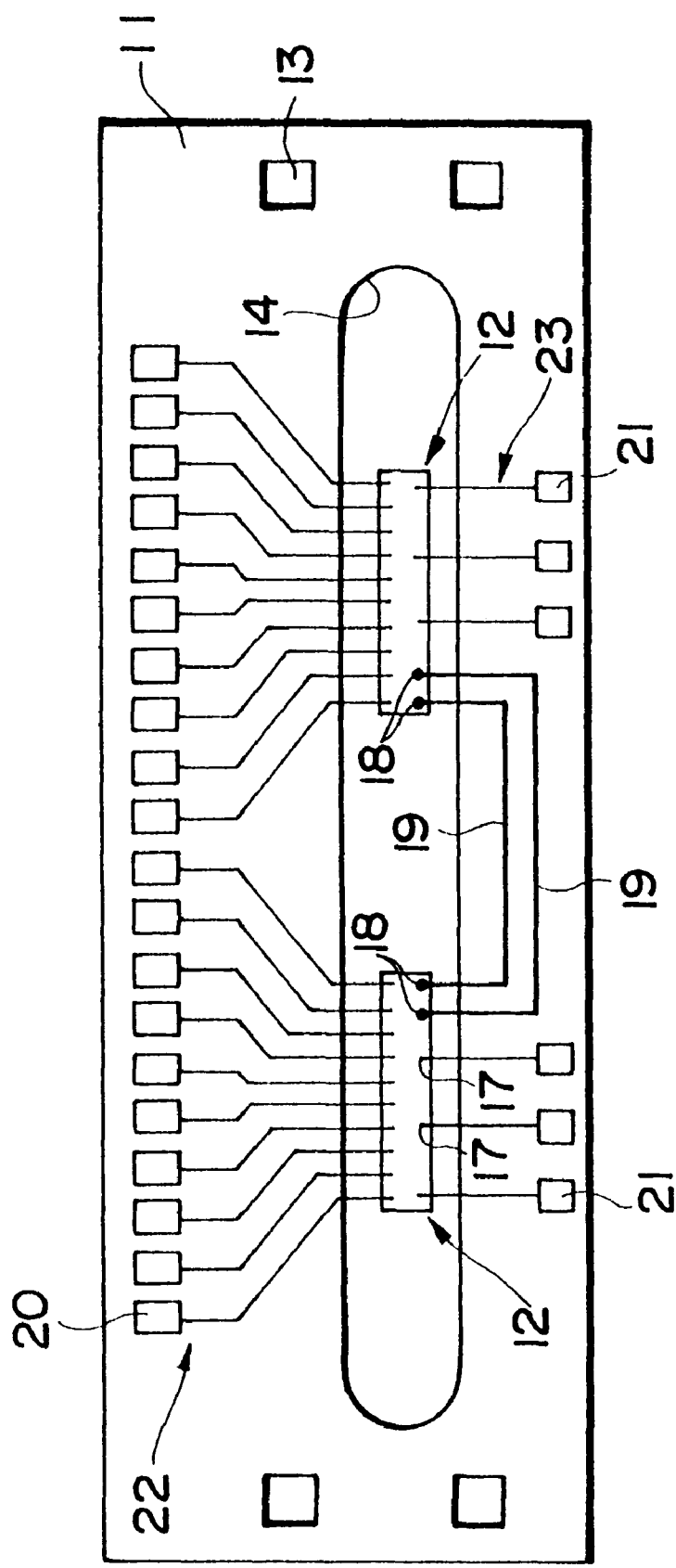
FIG. 3 is a plan view showing a third embodiment of the semiconductor device according to the present invention.

As shown in FIG. 3, the connection lines 19 as the connection circuits for the common terminals 18 can be realized by arranging the common terminals 18 as two of the input terminals 17 arranged on the other edges of the chip portions 12, and placing the connection lines 19 as two of the second lead circuit portions 23 on the TAB tape 11.

Embodiment 4

Figure 4:
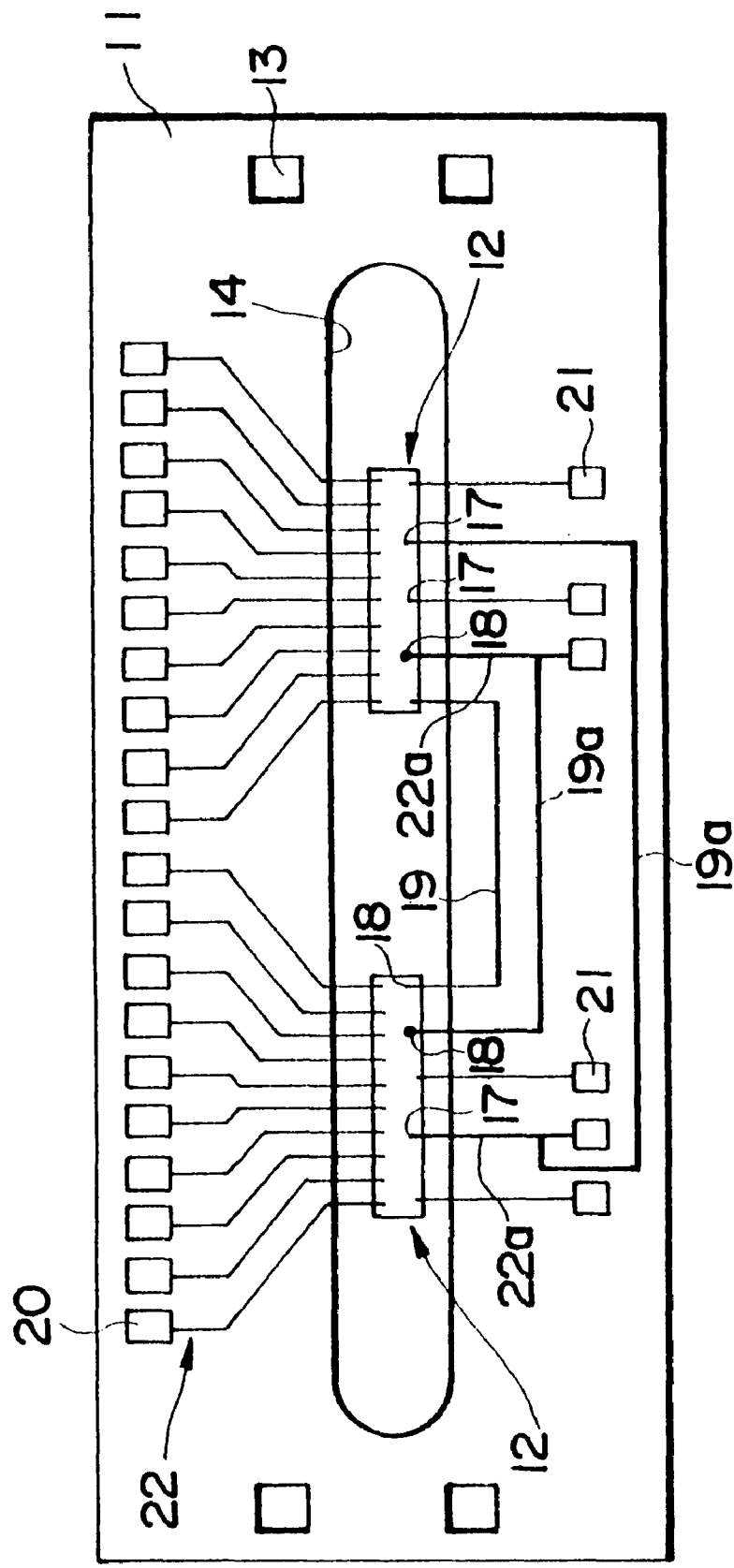
FIG. 4 is a plan view showing a fourth embodiment of the semiconductor device according to the present invention.

As shown in a fourth embodiment in FIG. 4, as the connection circuits for the common terminals, a branch line 19a can be extended from the second lead circuit portion 23 (23a) leading off the common terminal 18 or the input terminal 17 which functions as a common terminal, and through the branch line 19a, the common terminals 18 or 17 can be interconnected.

Embodiment 5

Figure 5:
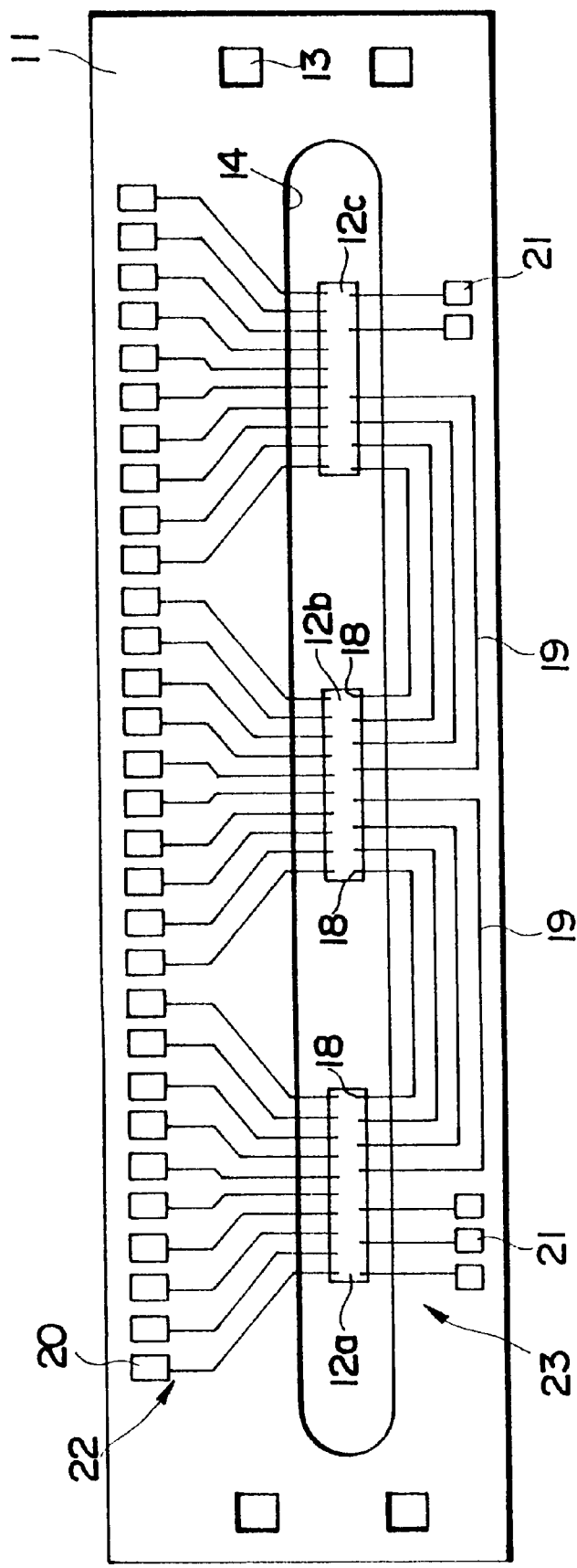
FIG. 5 is a plan view showing a fifth embodiment of the semiconductor device according to the present invention.

In the first to the fourth embodiments, description has been made of the cases in which a liquid crystal panel driver is formed by two chip portions 12. By contrast to those embodiments, as shown in FIG. 5, three divided chip portions 12a, 12b, 12c can be used so that the common terminals 18 of the chip portions 12 are interconnected through the connection circuit 19.

In this fifth embodiment, a driver can be so designed as to be formed of three divided chip portions 12, and the component chip portions 12 can be interconnected by connecting circuits 19 to work as a single driver.

Therefore, compared with the first to the fourth embodiments, the semiconductor device 10 in the fifth embodiment is favorable for the manufacture of a large-size driver and enables the use of smaller semiconductor chip portions 12.

Embodiment 6

Figure 6:
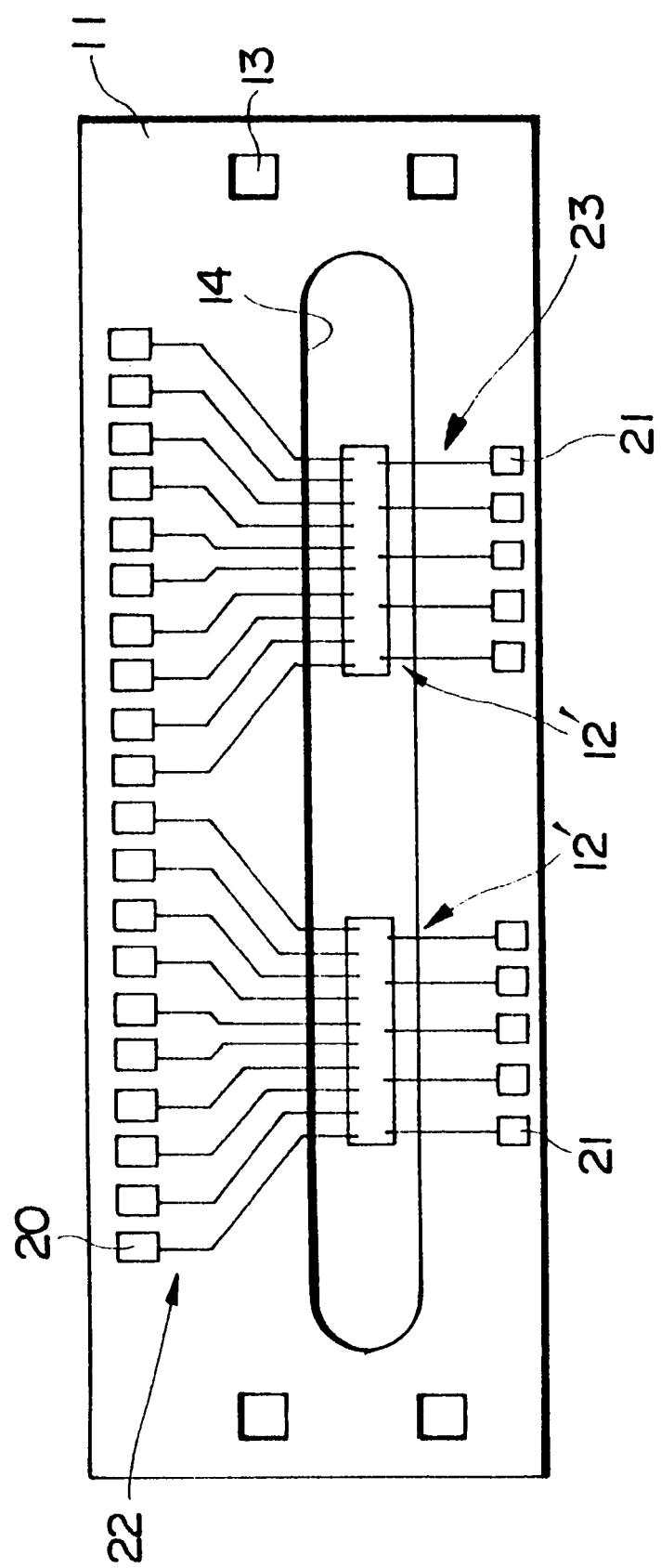
FIG. 6 is a plan view showing a sixth embodiment of the semiconductor device according to the present invention.

Instead of achieving a circuit function, such as a driver function, by electrical connection of a plurality of chip portions 12, it is possible to provide the same and independent driver circuit function for each chip 12' held on one TAB tape 11 in a sixth embodiment in FIG. 6.

Since each chip 12' functions as a driver circuit, the common connection lines to interconnect the chips 12' can be done away with. However, connection wiring for common control signal, power supply or the like between the chips 12' can be provided on or outside the carrier material 11.

Integrated circuits with different functions can be included in the individual chip 12'. However, as described above, the device mounting design and the production process can be simplified by furnishing the chips 12' on the same TAB tape with the same function under the same standards and the same size.

Embodiment 7

In order to simplify the interconnection of the input terminals as the common terminals for the two chip portions, multiple-layer-wiring technology should preferably be utilized in the chip portions 12 (or the chips 12').

Figure 7:
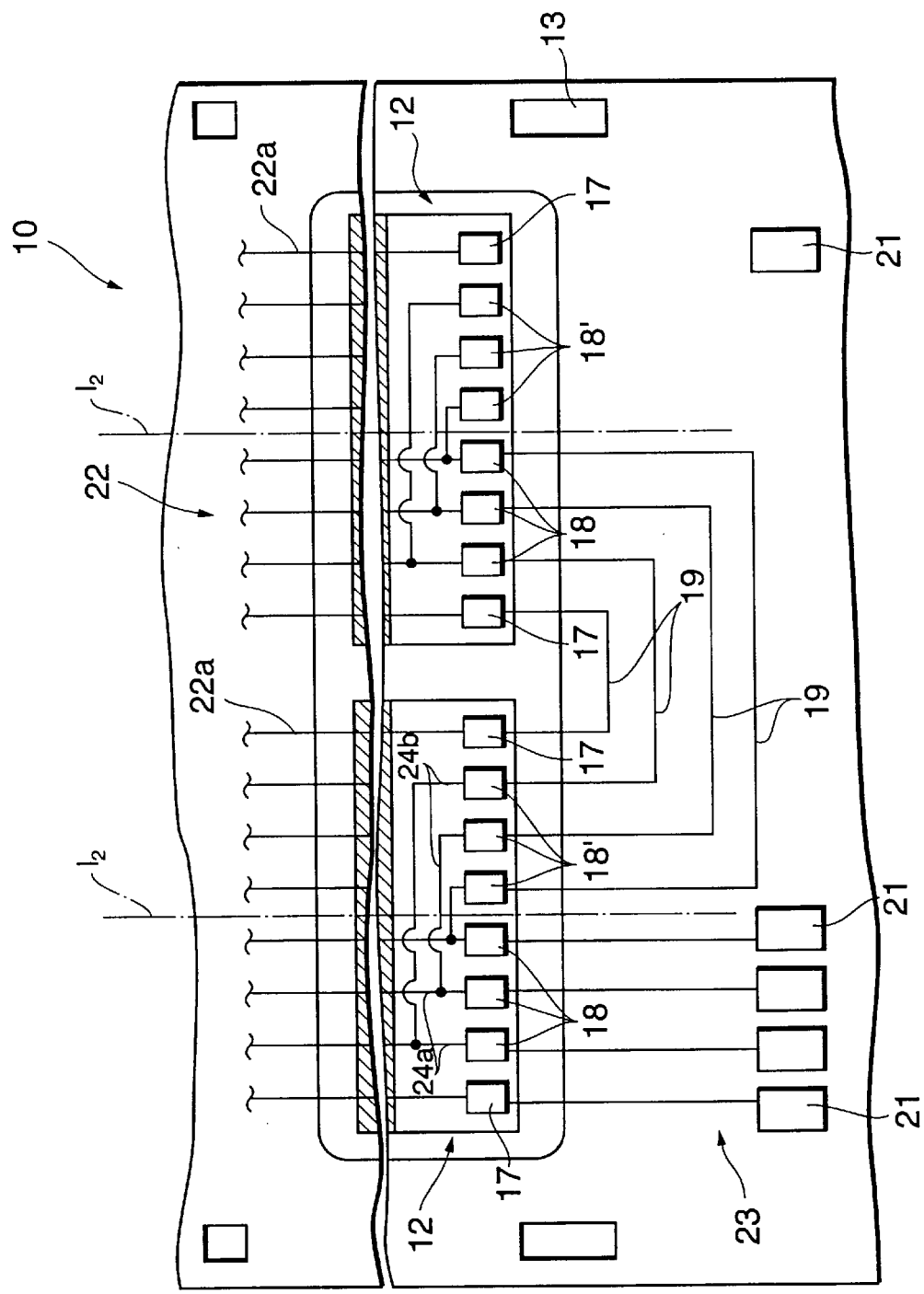
FIG. 7 is a plan view, partially on an enlarged scale, of the semiconductor device according to the present invention.

FIG. 7 is a plan view, partially on an enlarged scale, of a seventh embodiment of the present invention.

Arranged in a row on each chip portion 12 are input-output terminals 17 for cascade data signal, the common terminals 18 and branch terminals 18' connected to the common terminals 18, the common terminals 18 and the branch terminals 18' being originally some of the input terminals.

The input-output terminals 17, and those common terminals 18 and branch terminals 18', interconnected between the two chip portions 12, which are among the input terminals 18 and 18', are symmetrically arranged about a center line of each chip portion 12. The common terminals 18 and the branch terminals 18' which are on a one-to-one correspondence, are connected through branch lines 24a of the internal wiring 24a extending from the common terminals 18.

The wiring (24a and 24b) in the chip portions 12 can be laid easily by crossover arrangement without electrical short-circuit using the wellknown multiple-layer wiring technology indispensable for the formation of integrated circuits.

By the crossover arrangement of wiring (24a and 24b) in the chip portion 12, desired wiring can be installed between the chip portions 12 without incurring the complexity of the second lead circuit portions 23 normally caused by single-layer wiring on the TAB tape 11.

In the semiconductor device 10 in the seventh embodiment shown in FIG. 7, a case is shown where a plurality of chip portions 12 are so formed as to function as a single liquid crystal panel driver. In place of the chip portions 12 in FIG. 7, chips 12' can be used which respectively function as a single liquid crystal panel driver.

Embodiment 8

AS shown in FIG. 8, well-known buffers 25 may be inserted in the branch lines 24b from the internal wiring 24a to prevent the attenuation of an electric signal traveling through the branch lines. By the insertion of the buffers, the signal attenuation effect due to fan-out by branching off of a line can be eliminated.

The foregoing embodiments are concerned with the application of the present invention to the liquid crystal panel driver, but they are presented for the purpose of illustration only, and the present invention may be applied to semiconductor devices including various types of integrated circuits.

According to the present invention, as described above, the output terminals are distributed in-groups of an equal number to a plurality of semiconductor chips, and are held at proper intervals on the semiconductor chips arranged in a row. The results are that in addition to improved yield, the reliability of the lead circuit portions is increased, the size of the semiconductor device as a whole is prevented from becoming large, wider spaces between the output terminals can be secured, so that it is possible to provide semiconductor devices in compact size, with higher reliability, and at relatively low cost.

What is claimed is:

1. A semiconductor device comprising:
   a plurality of semiconductor chips, each having formed thereon a subdivision circuit portion of an electric circuit, each subdivision circuit portion performing one specified function of said electric circuit;
   a single carrier material which holds said plurality of semiconductor chip, wherein said subdivision circuit portions of said respective semiconductor chips are electrically interconnected to form said electric circuit; and
   a lead circuit including first lead circuit portions and second lead circuit portions, each first lead circuit portion connecting an output electrode on said carrier material with an output terminal on one of said semiconductor chips and each second circuit portion connecting an input electrode on said carrier material with an input terminal on one of said semiconductor chips, wherein said semiconductor chips are generally of a flat and rectangular shape, and are longitudinally aligned and mutually spaced apart by a distance corresponding to about a longitudinal length thereof, and wherein each semiconductor chip includes common terminals which are connected to corresponding common terminals of another semiconductor chip, and wherein said second lead circuit portions include at least one branch line connected between two corresponding common terminals of at least two semiconductor chips.

2. The semiconductor device according to claim 1, wherein said common terminals and said branch lines on one semiconductor chip and said common terminals and said branch lines on another semiconductor chip are arranged symmetrically about a center line passing through said semiconductor chips.

3. A semiconductor device comprising:

a plurality of semiconductor chips, each having formed thereon a subdivision circuit portion of an electric circuit, each subdivision circuit portion performing one specified function of said electric circuit;

a single carrier material which holds said plurality of semiconductor chip, wherein said subdivision circuit portions of said respective semiconductor chips are electrically interconnected to form said electric circuit; and a lead circuit including first lead circuit portions and second lead circuit portions, each first lead circuit portion connecting an output electrode on said carrier material with an output terminal on one of said semiconductor chips and each second circuit portion connecting an input electrode on said carrier material with an input terminal on one of said semiconductor chips, wherein said semiconductor chips are generally of a flat and rectangular shape, and are longitudinally aligned and mutually spaced apart by a distance corresponding to about a longitudinal length thereof, and wherein each semiconductor chip includes common terminals which are connected to corresponding common terminals of another semiconductor chip, and wherein each semiconductor chip further includes on-chip wiring forming branch lines connected to at least two common terminals of said semiconductor chip.

4. The semiconductor device according to claim 3, wherein said common terminals and said branch lines on one semiconductor chip and said common terminals and said branch lines on another semiconductor chip are arranged symmetrically about a center line passing through said semiconductor chips.

5. The semiconductor device according to claim 3, wherein said on-chip wiring is formed by a multiple-layer wiring technology.

6. The semiconductor device according to claim 3, wherein buffers are inserted in said branch lines to prevent signals from being attenuated.

7. A semiconductor device comprising:

a plurality of semiconductor chips each generally having a rectangular shape, and each having a plurality of output terminals adjacent one edge and a plurality of input terminals adjacent another edge;

a carrier material for holding said semiconductor chips in a row to arrange said input terminals and said output terminals of said semiconductor chips in rows and also having input electrodes and output electrodes corresponding to said input and output terminals of said semiconductor chips; and a lead circuit including first lead circuit portions and second lead circuit portions, each first lead circuit portion connecting an output electrode on said carrier material with an output terminal on one of said semiconductor chips and each second circuit portion connecting an input electrode on said carrier material with an input terminal on one of said semiconductor chips, wherein the spaces between said output electrodes on the carrier material corresponding to said output terminals on said semiconductor chips are wider than the spaces between said output terminals on said semiconductor chips, and wherein each said first lead circuit portion includes a first straight portion extending from an output terminal outwardly of said semiconductor chip substantially at right angles from said one edge of said semiconductor chip, said first straight portions extending evenly spaced apart from one another, a diagonally extending portion extending from an outer end of said first straight portion at angle to said first straight portion, and a second straight portion extending from an outer end of said diagonally extending portion up to a corresponding output electrode, and wherein each semiconductor chip includes common terminals which are connected to corresponding common terminals of another semiconductor chip, and wherein said second lead circuit portions include at least one branch line connected between two corresponding common terminals of at least two semiconductor chips.

8. A semiconductor device comprising:

a plurality of semiconductor chips each generally having a rectangular shape, and each having a plurality of output terminals adjacent one edge and a plurality of input terminals adjacent another edge;

a carrier material for holding said semiconductor chips in a row to arrange said input terminals and said output terminals of said semiconductor chips in rows and also having input electrodes and output electrodes corresponding to said input and output terminals of said semiconductor chips; and a lead circuit including first lead circuit portions and second lead circuit portions, each first lead circuit portion connecting an output electrode on said carrier material with an output terminal on one of said semiconductor chips and each second circuit portion connecting an input electrode on said carrier material with an input terminal on one of said semiconductor chips, wherein the spaces between said output electrodes on the carrier material corresponding to said output terminals on said semiconductor chips are wider than the spaces between said output terminals on said semiconductor chips, and wherein each said first lead circuit portion includes a first straight portion extending from an output terminal outwardly of said semiconductor chip substantially at right angles from said one edge of said semiconductor chip, said first straight portions extending evenly spaced apart from one another, a diagonally extending portion extending from an outer end of said first straight portion at angle to said first straight portion, and a second straight portion extending from an outer end of said diagonally extending portion up to a corresponding output electrode, and wherein each semiconductor chip includes common terminals which are connected which are connected to corresponding common terminals of another semiconductor chip, and wherein said second lead circuit portions includes at least one branch line connected between two corresponding common terminals of at least two semiconductor chips, and wherein said common terminals and said branch lines on one semiconductor chip and said common terminals and said branch lines on another semiconductor chip are arranged symmetrically about a center line passing through said semiconductor chips.

9. A semiconductor device comprising:

a plurality of semiconductor chips each generally having a rectangular shape, and each having a plurality of output terminals adjacent one edge and a plurality of input terminals adjacent another edge;

a carrier material for holding said semiconductor chips in a row to arrange said input terminals and said output terminals of said semiconductor chips in rows and also having input electrodes and output electrodes corresponding to said input and output terminals of said semiconductor chips; and a lead circuit including first lead circuit portions and second lead circuit portions, each first lead circuit portion connecting an output electrode on said carrier material with an output terminal on one of said semiconductor chips and each second circuit portion connecting an input electrode on said carrier material with an input terminal on one of said semiconductor chips, wherein the spaces between said output electrodes on the carrier material corresponding to said output terminals on said semiconductor chips are wider than the spaces between said output terminals on said semiconductor chips, and wherein each said first lead circuit portion includes a first straight portion extending from an output terminal outwardly of said semiconductor chip substantially at right angles from said one edge of said semiconductor chip, said first straight portions extending evenly spaced apart from one another, a diagonally extending portion extending from an outer end of said first straight portion at angle to said first straight portion, and a second straight portion extending from an outer end of said diagonally extending portion up to a corresponding output electrode, and wherein each semiconductor chip includes common terminals which are connected to corresponding common terminals of another semiconductor chip, and wherein each semiconductor chip further includes on-chip wiring forming branch lines connected to at least two common terminals of said semiconductor chip.

10. The semiconductor device according to claim 9, wherein said common terminals and said branch lines on one semiconductor chip and said common terminals and said branch lines on another semiconductor chip are arranged symmetrically about a center line passing through said semiconductor chips.

11. The semiconductor device according to claim 9, wherein said on-chip wiring is formed by a multiple-layer wiring technology.

12. The semiconductor device according to claim 9, wherein buffers are inserted in said branch lines to prevent signals from being attenuated.

* * * * *